United States Patent
Takahashi et al.

(10) Patent No.: US 7,501,843 B2
(45) Date of Patent: Mar. 10, 2009

(54) MOVEMENT AMOUNT OPERATION CORRECTION METHOD FOR PROBER, MOVEMENT AMOUNT OPERATION CORRECTION PROCESSING PROGRAM, AND PROBER

(75) Inventors: Masatomo Takahashi, Mitaka (JP); Takahiro Hokida, Mitaka (JP); Ken Kamikariya, Mitaka (JP); Tetsuo Hata, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 226 days.

(21) Appl. No.: 11/413,368

(22) Filed: Apr. 27, 2006

(65) Prior Publication Data

US 2006/0267613 A1 Nov. 30, 2006

(30) Foreign Application Priority Data

May 31, 2005 (JP) .............................. 2005-158613

(51) Int. Cl.
G01R 31/02 (2006.01)
(52) U.S. Cl. ..................................................... 324/758
(58) Field of Classification Search ................. 324/754, 324/765, 758, 761–762, 158.1, 760
See application file for complete search history.

(56) References Cited

U.S. PATENT DOCUMENTS 5,644,245 A * 7/1997 Saitoh et al. ................ 324/754
7,135,883 B2 * 11/2006 Komatsu .................... 324/765

FOREIGN PATENT DOCUMENTS

| JP | 6-318622 | 11/1994 |
|---|---|---|
| JP | 7-147304 | 6/1995 |
| JP | 7-288270 | 10/1995 |
| JP | 7-312382 | 11/1995 |
| JP | 10-150081 | 6/1998 |

(Continued)

OTHER PUBLICATIONS

Patent Abstract of Japan, Publication No. 10-150081, Published on Jun. 2, 1998, in the name of Chiba.

(Continued)

*Primary Examiner*—Ha Tran T Nguyen
*Assistant Examiner*—Tung X Nguyen
(74) *Attorney, Agent, or Firm*—Christie, Parker & Hale, LLP

(57) ABSTRACT

A movement amount operation correction method of a prober capable of easily performing an error measurement for the movement distance. In the method, the position of a probe of a probe card is detected by a probe position detection means, the position of an electrode is detected by a wafer alignment means, the position of the probe trace is detected by bringing the electrode into contact with the probe and processing an image of a probe trace on the electrode touched by the wafer alignment means, the image of the probe trace and a probe trace mark indicating the detected position of the probe are displayed on a display device, and an operator confirms or corrects the position of the probe trace mark on the image, calculates a shift of the position of the probe trace mark from a predetermined position, and corrects a movement amount operation correction value based on the calculated shift.

7 Claims, 7 Drawing Sheets

FOREIGN PATENT DOCUMENTS

| JP | 10-0274558 | 12/2000 |
|----|------------|---------|
| JP | 2002-170855 | 6/2002 |
| JP | 2004-79733 | 3/2004 |

OTHER PUBLICATIONS

Patent Abstract of Japan, Publication No. 2002-170855, Published on Jun. 14, 2002, in the name of Wada.

Patent Abstract of Japan, Publication No. 2004-079733, Published on Mar. 11, 2004, in the name of Wada.

Patent Abstracts of Japan, Publication No. 06-318622, dated Nov. 15, 1994, in the name of Hiroshi Suzuki et al.

Patent Abstracts of Japan, Publication No. 07-147304, dated Jun. 6, 1995, in the name of Saito Satoshi.

Patent Abstracts of Japan, Publication No. 07-288270, dated Oct. 31, 1995, in the name of Terada Akihiro.

Patent Abstracts of Japan, Publication No. 07-312382, dated Nov. 28, 1995 he name of Hiroshi Suzuki et al.

* cited by examiner

R

S1

S2

S1+S2−R

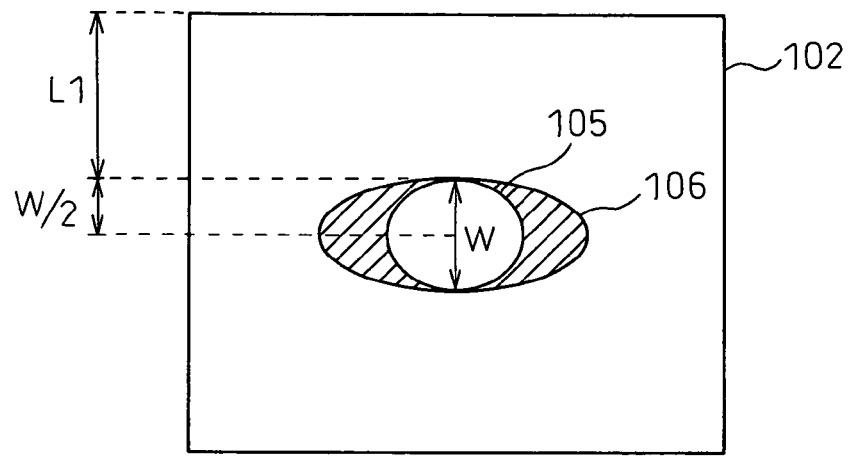
FIG. 7A
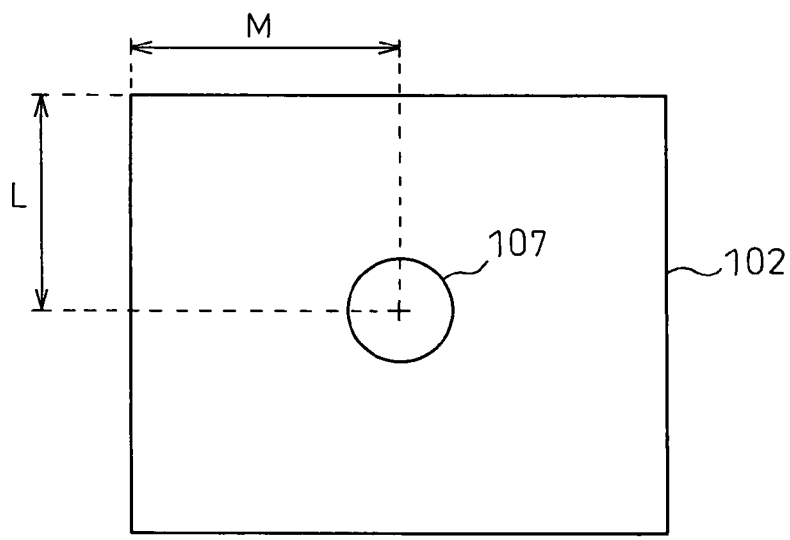
FIG. 7B
FIG. 8
| X POSITION (mm) | 0 | 7.5 | 15 | 22.5 | ---- | Xn |
|---|---|---|---|---|---|---|
| CORRECTION VALUE (μm) | +0.5 | +0.1 | −0.2 | ±0 | ---- | d |

MOVEMENT AMOUNT OPERATION CORRECTION METHOD FOR PROBER, MOVEMENT AMOUNT OPERATION CORRECTION PROCESSING PROGRAM, AND PROBER

CROSS-REFERENCE TO RELATED APPLICATION

This application claims priority of Japanese Patent Application Number 2005-158613, filed on May 31, 2005.

BACKGROUND OF THE INVENTION

The present invention relates to movement amount operation correction processing for correcting a correction value when calculating an amount of movement of a stage for bringing a probe of a probe card into contact with an electrode in a prober used to inspect a semiconductor device (chip) with a tester.

A semiconductor manufacturing process has a number of processes and various inspections are carried out in various manufacturing processes in order to maintain the quality and improve the yield. For example, at the stage in which plural chips of semiconductor device are formed on a semiconductor wafer, a wafer level inspection is carried out. In this inspection the electrode of the semiconductor device of each chip is connected to a tester, power and a test signal are supplied from the tester, the signal output from the semiconductor device is measured with the tester, and whether each chip operates normally is checked electrically.

After the wafer level inspection, the wafer is bonded to a frame and cut into individual chips by a dicer. Only the cut chips that have been confirmed to operate normally are packaged in the next assembling process and the defective chips are removed from the assembling process. Further, the final packaged products are subjected to an inspection on shipping.

FIG. 1 is a diagram showing a general configuration of a system for carrying out a wafer level inspection. The system for carrying out a wafer level inspection comprises a prober for bringing a probe 11 into contact with an electrode of each chip on a wafer and a tester 5 electrically connected to the probe and supplying power and a test signal to each chip for an electrical inspection and, at the same time, detecting the output signal from each chip to measure whether each chip operates normally. Reference numbers 1 to 4 denote parts constituting a case of the prober. To an upper plate 4, a probe card 12 having the probe 11 that comes into contact with an electrode and a wafer alignment camera 13 are attached. A base section 1 is provided with a moving mechanism 24 for moving a stage 22. The stage 22 is provided with a wafer chuck 21 for holding a wafer 100 by means of vacuum adsorption and a probe position camera 23 for detecting the position of the probe 11 of the probe card 12. The wafer chuck 21 is capable of not only moving in three-axis directions by means of the moving mechanism 24 but also rotating about an axis in the vertical direction as a center. There may be a case where the wafer alignment camera is attached to a support plate 3 of the case.

The tester 5 is mounted on the upper plate 4 of the case of the prober. The electric terminal of the tester 5 is connected to the terminal of the probe card 12 and electrically connected to the probe 11. The tester 5 and the prober are separate products and a user configures a wafer level inspection system by adequately combining the tester 5 and the prober in accordance with a chip formed on a wafer. Further, it is necessary for the probe card 12 to comprise a probe 11 arranged in accordance with an electrode of a chip to be inspected and the probe card 12 is adequately exchanged in accordance with the chip (semiconductor device).

An image photographed by the wafer alignment camera 13 and the probe position camera 23 is sent to an image processing/operation processing section 31. The image processing/operation processing section 31 detects the position of the electrode of each chip of the wafer 100 held by the wafer chuck 21 from the image of the wafer alignment camera 13 and detects the position of the probe 11 of the probe card 12 from the image of the probe position camera 23. The image processing/operation processing section 31 sends data about the detected position of the electrode of each chip and the position of the probe 11 of the probe card 12 to a movement control section 32. The movement control section 32 has a movement amount operation section 33 for calculating the amount of movement of the stage 22 necessary to bring a predetermined position of an electrode into contact with the probe 11 based on the data etc. The movement control section 32 controls the moving mechanism 24 based on the amount of movement calculated by the movement amount operation section 33 and brings the electrode into contact with the probe 11 by moving the stage 22.

By the way, only the movement control section 32 is shown here but, in reality, a control section for performing various controls of temperature adjustment, rotation of the wafer chuck 21, etc., is provided and the movement control section 32 is configured as part of the control section. The control section is constituted by a computer. Further, the image processing/operation processing section 31 displays the image of the wafer alignment camera 13 and the image of the probe position camera 23 on a display device 34 without any processing or after image processing. An operator performs various settings and operations while watching the image on the display device 34.

FIG. 2 is a diagram showing a configuration of the portion of the probe card 12. The upper plate 4 of the case of the prober is provided with a head stage 15 and the head stage 15 is provided with a cardholder 14. The probe card 12 having the probe 11 needs to be exchanged in accordance with a chip to be inspected as described above, and is detachably attached to the cardholder 14.

When bringing the probe 11 into contact with an electrode, after moving the wafer chuck 21 holding the wafer 100 such that the electrode is located immediately under the probe 11, the electrode is brought into contact with the probe 11 by lifting the wafer chuck 21. At this time, by applying a voltage to the terminal of the tester to be connected to the probe 11, it is made possible to detect that the probe 11 has come into contact with the electrode, then the wafer chuck 21 is controlled to stop ascending.

As described above, the configuration of a conventional wafer level inspection system has been explained. However, the wafer level inspection system is described in, for example, Japanese Unexamined Patent Publication (Kokai) No. 10-150081, Japanese Unexamined Patent Publication (Kokai) No. 2002-170855, Japanese Unexamined Patent Publication (Kokai) No. 2004-79733, etc. and, therefore, a further explanation is omitted here.

Recently, semiconductor devices (chips) have become more highly integrated and reduced in size and, in accordance with this, the size of an electrode and the intervals in the arrangement have been reduced. Because of this, it is demanded that the precision of the alignment of the probe 11 and an electrode be about ±2 μm. As described above, the arrangement of the probe 11 of the probe card 12 differs from chip to chip to be inspected and it is necessary to exchange the probe card 12 in accordance with the chip to be inspected. The probe card 12 is attached by engaging it with the cardholder 14, however, the positional precision is specified by the errors of the engagement and it is not possible to realize the precision of ±2 µm described above. Further, the probe itself can have errors of position. Furthermore, the probe is made of a thin spring material and if contact with the electrode is repeated, the position of the probe will change. On the other hand, a wafer is held by a wafer chuck by means of vacuum adsorption etc., however, it is not possible to hold the position with high precision.

Therefore in the prober, as shown in FIG. 1, the wafer alignment camera 13 photographs each chip of the wafer held by the wafer chuck and the position of electrode of each chip is recognized by image processing. The wafer alignment camera 13 photographs a microscopic image of the chip and it is possible to recognize the position of the electrode with high precision. Similarly, by performing image processing of the image of the probe 11 of the probe card 12 photographed by the probe position camera 23, it is possible to recognize the position of the probe 11 with high precision.

FIG. 3A to FIG. 3D are diagrams for explaining operation processing of the amount of movement for bringing the electrode into contact with the probe 11 based on the position of the electrode and the position of the probe 11 recognized as described above. Here, the operation of the amount of movement only in the direction of one axis (X-axis) is explained, however, this similarly applies to the directions of the other two axes.

FIG. 3A shows a state in which the axis of the wafer alignment camera 13 coincides with the axis of the probe position camera 23. In other words, it shows a state in which the origin of the image of the wafer alignment camera 13 coincides with the origin of the image of the probe position camera 23. It is assumed that the moving mechanism at this time indicates a movement position R. It is not necessary for the moving mechanism to be capable of moving until the axis of the probe position camera 23 actually coincides with the axis of the wafer alignment camera 13, and it is only necessary to be capable of specifying the movement position R of the moving mechanism when the axis of the wafer alignment camera 13 virtually coincides with the axis of the probe position camera 23.

Next, as shown in FIG. 3B, the probe position camera 23 is moved to under the probe 11A of the probe card 12 and the position of the probe 11A in the image of the probe position camera 23 is detected. Actually, the probe of the probe card 12 is provided in plural in accordance with the number of electrodes of the chip and the positions of all of the probes are detected. Here, for simplicity of explanation, it is assumed that the probe is single and is located at the origin of the image of the probe position camera 23 and a movement position S1 of the moving mechanism at this time is S1. Therefore, the distance between the axis of the wafer alignment camera 13 and the probe 11A is S1-R.

Next, as shown in FIG. 3C, the wafer 100 is moved to under the wafer alignment camera 13 and after the wafer chuck 21 is rotated such that the arrangement direction of the electrode of the chip coincides with the arrangement direction of the probe 1, the position of the electrode of the chip is detected. As plural electrodes of the chip are provided, the positions of all of the electrodes are detected. By the way, a plurality of chips are formed on the wafer 100 and it is necessary to detect the position of the electrodes of each chip, however, there may be a case where the position of the electrodes of some of the chips are detected and the position of the electrodes of the other chips are calculated by operation because actually, the chips are regularly arranged with high precision.

In the case of plural electrodes, plural probes are arranged at corresponding positions for plural electrodes and whether the plural electrodes can be brought into contact with the plural probes is judged and further the positional relationship between all of the electrodes and all of the probes is calculated. As the position of each electrode varies and the position of each probe also varies, the positional relationship is one in which the difference of each probe from the predetermined position of the corresponding electrode is a minimum, as a whole. This positional relationship does not relate directly to the present invention and, therefore, it is assumed here that the electrode is one and is located at the origin of the image of the wafer alignment camera 13, and a movement position of the moving mechanism at this time is S2.

The electrode is located at the origin of the image of the wafer alignment camera 13 and, in order to bring the electrode into contact with the probe 11A S1-R away from the origin of the image of the wafer alignment camera 13, it is necessary to move only by S1-R from the state in FIG. 3C, that is, the state in which the movement position of the moving mechanism is at S2. FIG. 3D shows a state in which the movement position of the moving mechanism is at S1+S2-R, and the electrode of the chip at this time is located immediately under the probe 11A, therefore, if the wafer is lifted from this position, the probe 11A comes into contact with a predetermined position of the electrode.

The amount of movement to bring the electrode into contact with the probe of the probe card is calculated as described above, however, the precision of the amount of movement is affected by the positional relationship between the wafer alignment camera 13 and the probe position camera 23, the detection precision of the wafer alignment camera 13 and the probe position camera 23, the movement precision of the moving mechanism, etc.

The moving mechanism is capable of high precision control, however, if it is aimed to maintain a high precision across a wide movement range, there arises a problem in that the cost is increased accordingly. Therefore, movement with a high precision is realized in the moving mechanism by measuring errors for the movement distance in advance to store the amount of correction in a correction table of the movement amount operation section 33 and by performing correction in accordance with the movement position.

If the error measurement for the movement distance for creating the above-mentioned correction table is performed in an actual prober, the amount of correction including the positional relationship between the wafer alignment camera 13 and the probe position camera 23 is calculated as a result.

SUMMARY OF THE INVENTION

The above-mentioned correction table is created at the time of the manufacture of a prober, however, there is a problem that the movement errors change with the lapse of time. Particularly, a prober is required to carry out an inspection of a chip under various environmental conditions such a high temperature state, a low temperature state, etc., and the case and the moving mechanism are likely to change with lapse of time.

It is not easy to actually carry out an error measurement for the movement distance in a prober. Conventionally, a specialist carries out an error measurement for the movement distance by bringing the electrode into contact with the probe and observing the contact trace of the probe (probe trace) of the electrode using a wafer and a probe card used in an actual measurement. However, this work requires a skill because it is difficult to recognize the probe trace etc., therefore, there has been a problem in that specialists able to perform the work are limited, the work time is long, and the precision is insufficient.

In order to solve such a problem, cited document 3 describes a method for recognizing the probe position by providing a pseudo probe means for outputting light beams and recognizing a point on the electrode to which the light beams converge, instead of recognizing the probe trace of the electrode. This method has an advantage that inaccurate recognition of the probe trace is not possible, however, it is necessary to newly provide a pseudo probe means and there arises a problem in that the method is affected by the variations in the positional relationship between the pseudo probe means and other portions.

An object of the present invention is to realize a movement amount operation correction method of a prober capable of easily carrying out the error measurement for the movement distance, which has conventionally been carried out by a skilled specialist.

In order to realize the above object, in a movement amount operation correction method of a prober of the present invention, the probe trace of an electrode is recognized by image processing, the recognition result is displayed on the image, and it is made possible for an operator to easily recognize the probe trace.

In other words, a movement amount operation correction method of a prober of the present invention is a movement amount operation correction method of a prober for correcting a movement amount operation correction value in a prober the prober comprising: a probe card having a probe; a wafer chuck for holding a wafer on which an electrode is formed; a moving mechanism for moving the wafer chuck; a probe position detection means for detecting the position of the probe of the probe card; a wafer alignment means for detecting the position of the electrode of the wafer held b the wafer chuck; and a movement control section for controlling the moving mechanism, the movement control section comprising a movement amount operation section for calculating an amount of movement by the moving mechanism such that a predetermined position of the electrode is brought into contact with the probe based on the position of the probe detected by the probe position detection means, the position of the electrode detected by the wafer alignment means, and the movement amount operation correction value, the method comprising the steps of:

with the probe position detection means, detecting the position of the probe of the probe card;

with the wafer alignment means, detecting the position of the electrode;

bringing the electrode into contact with the probe;

with the wafer alignment means, processing an image of a probe trace on the electrode touched by the probe to detect the position of the probe trace;

displaying an image of the probe trace and a probe trace mark indicating the detected position of the probe trace on a display device;

by an operator, confirming or correcting the position of the probe trace mark on the image;

calculating a shift of the position of the probe trace mark from the predetermined position; and correcting the movement amount operation correction value based on the calculated shift.

The reason that the correction of the movement amount operation is performed in a prober is to accurately bring the probe into contact with the electrode. From this standpoint, it is most preferable to recognize the position of the probe trace that occurs on the electrode. However, a probe trace on an electrode is not clear and it is not possible to highly precisely recognize the position by means of image processing, therefore, a specialist recognizes the position conventionally. However, even if insufficient, the work of an operator is made easier by recognizing the probe trace by means of image processing and displaying a mark indicating the probe trace together with the image of the probe trace. Due to this, it is made possible for even a normal operator to perform the work.

The movement amount operation correction method of the present invention can be performed using a probe card and a wafer used in an inspection as before, however, it may also be possible to use a special-purpose probe card having a special-purpose probe and a wafer having a special-purpose electrode on which a probe trace readily occurs for the purpose of recognizing the probe trace more accurately. A special-purpose probe is, for example, a vertical sharp probe and the probe trace is circular, therefore, the position in the two-axis directions can be recognized accurately. Further, a special-purpose electrode is an electrode manufactured of a softer material than that of a normal electrode or by a forming method by which an electrode is made softer.

A probe of a probe card used in an inspection has flexibility and an elongated shape as shown in FIG. 2 and the portion near the front end part is inclined with respect to the surface of an electrode, therefore, if the wafer is lifted and brought into contact with the electrode, the probe slides on the surface of the electrode and a trace extending in one direction appears. The position of the probe trace in the extending direction is difficult to recognize accurately. In contrast to this, in the direction perpendicular to the extending trace, a trace corresponding to the width of the probe occurs, therefore, the position of the probe trace can be recognized more accurately. Therefore, it is preferable to use a probe card having two probes extending in different directions (a probe card usually has such probes) and detect only the position in the direction perpendicular to the respective directions in which the probes extend from the probe trace.

As described above, according to the present invention, the correction work of the movement distance of a prober is made easy to perform. Due to this, as it is made possible for a non-specialist to perform the work, correction can be performed at any time as the need arises and the movement for contact in a prober can be maintained with high precision, therefore, even a very fine chip (semiconductor device) can be measured.

BRIEF DESCRIPTION OF THE DRAWINGS

The features and advantages of the invention will be more clearly understood from the following descriptions taken in conjunction with the accompanying drawings in which:

FIG. 7A and FIG. 7B are diagrams showing an example of a probe trace mark and a probe trace; and FIG. 8 is a diagram showing an example of a correction table.

DESCRIPTION OF THE PREFERRED EMBODIMENTS

Figure 1:
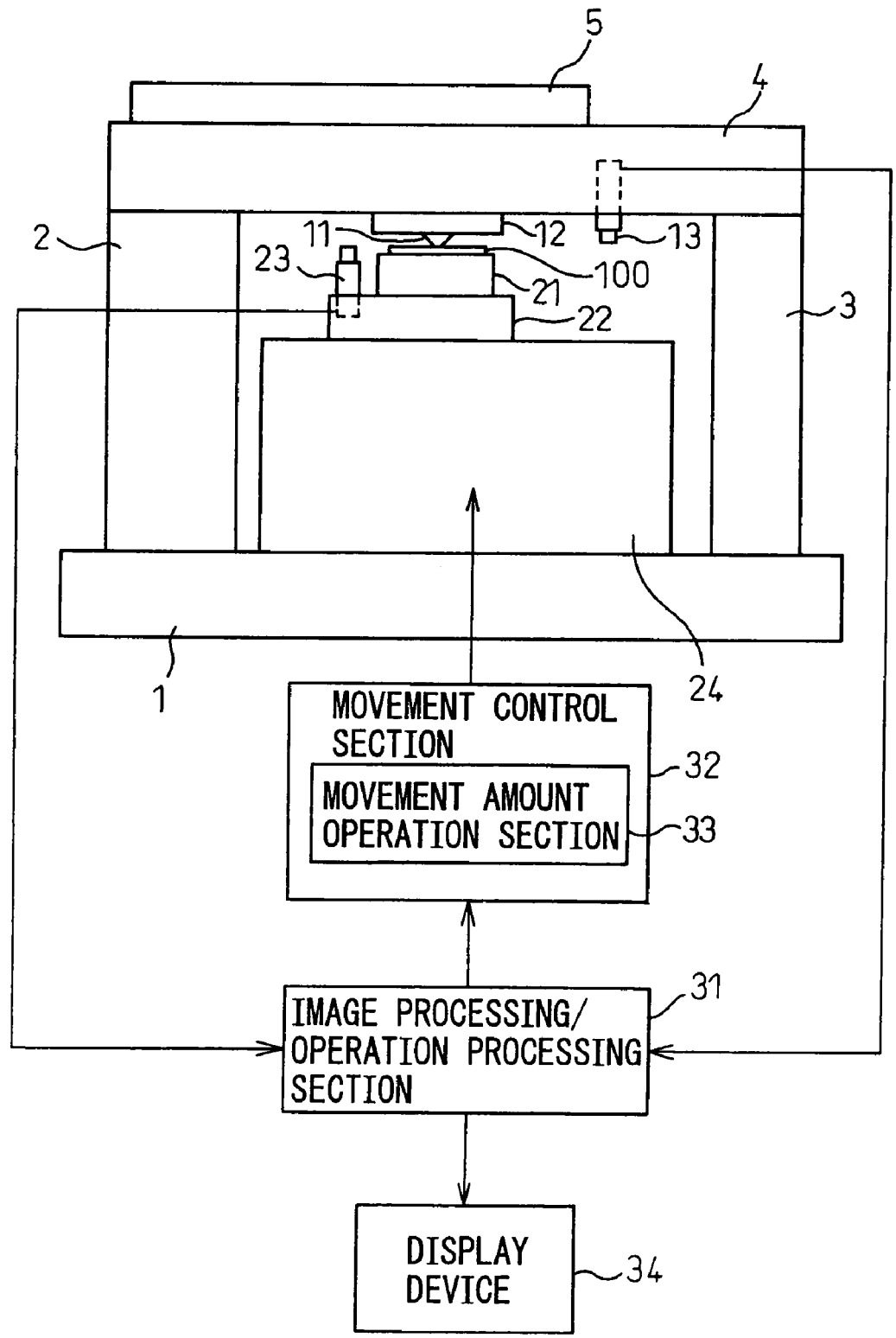
FIG. 1 is a diagram showing an entire configuration of a conventional wafer level inspection system.
Figure 2:
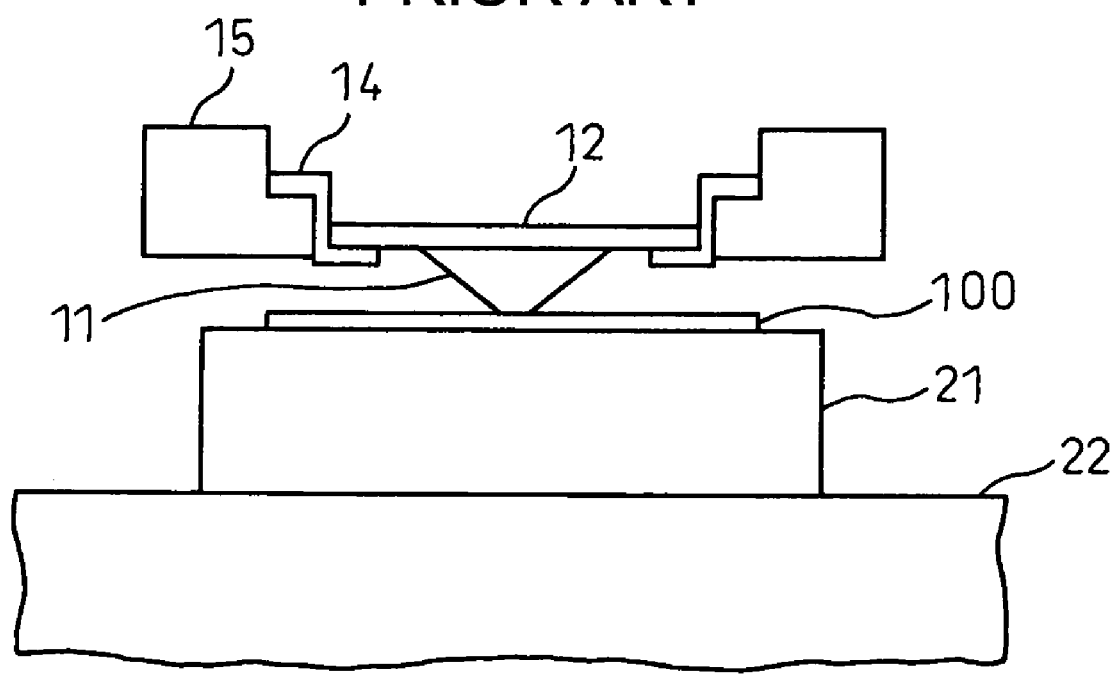
FIG. 2 is a diagram for explaining a configuration of a mounting part of a probe card.
Figure 3A:
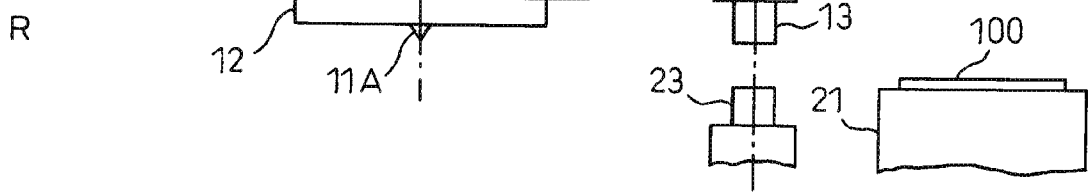
FIG. 3A to FIG. 3D are diagrams for explaining alignment in a prober.
Figure 3B:
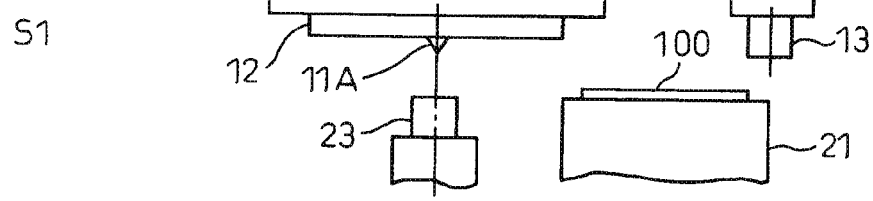
Figure 3C:
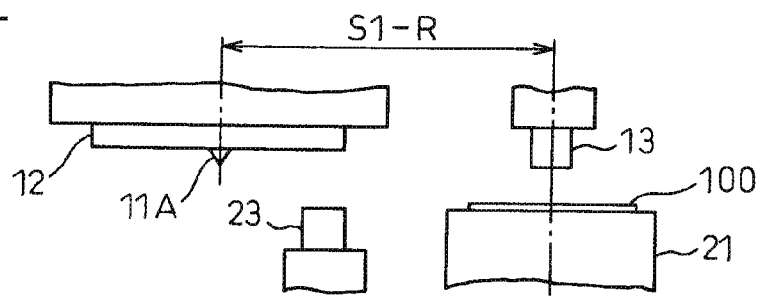
Figure 3D:
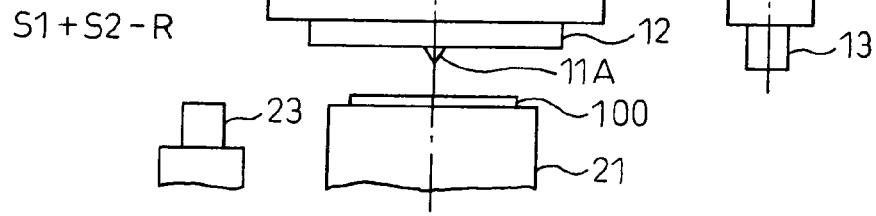

A prober in an embodiment of the present embodiment has an entire configuration as shown in FIG. 1 and is different in that a program for embodying the present invention is installed in a computer constituting an image processing/operation processing section 31, a movement control section 32 and a movement amount operation section 33.

Figure 4:
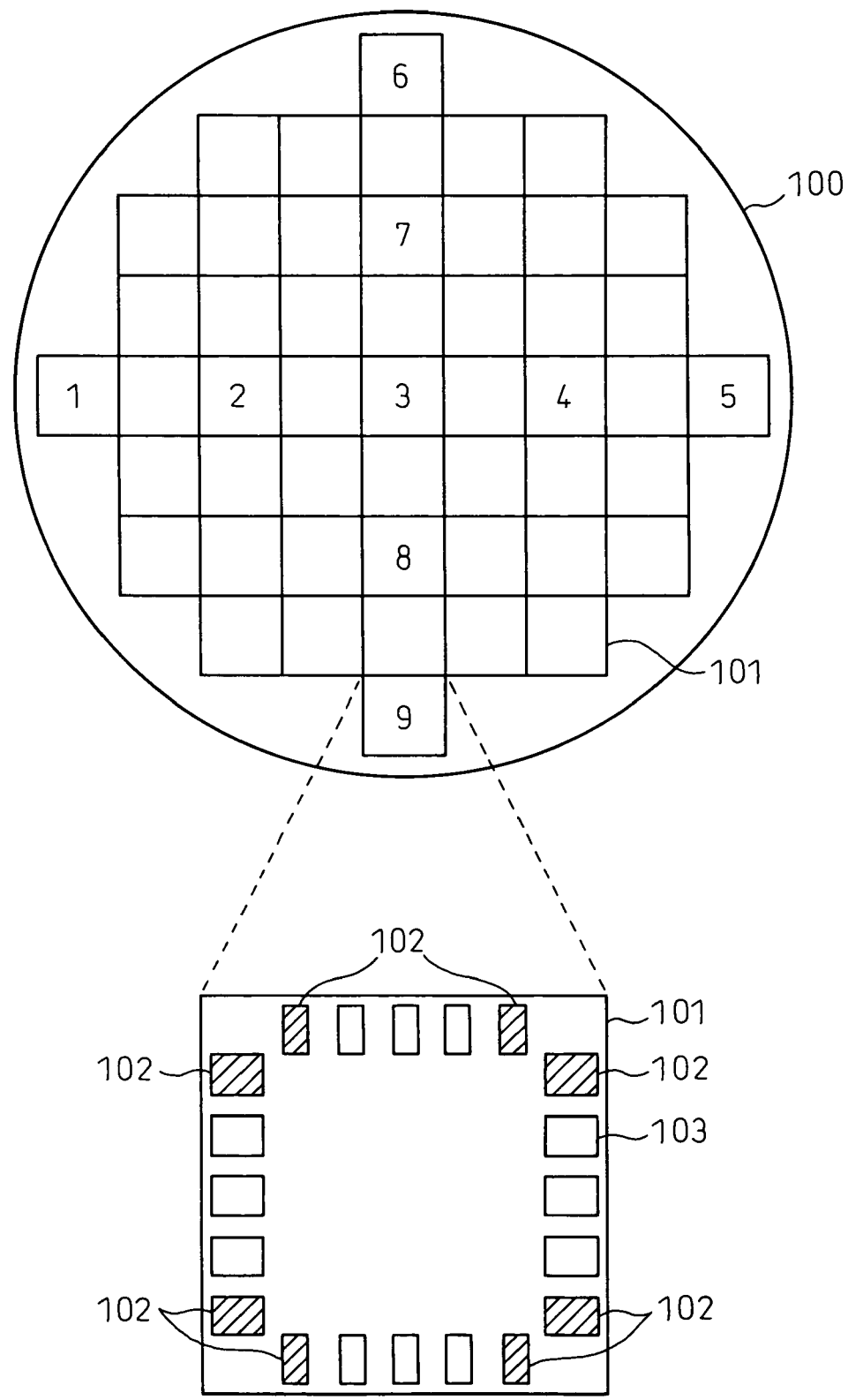
FIG. 4 is a diagram showing a wafer used in an embodiment.
Figure 5A:
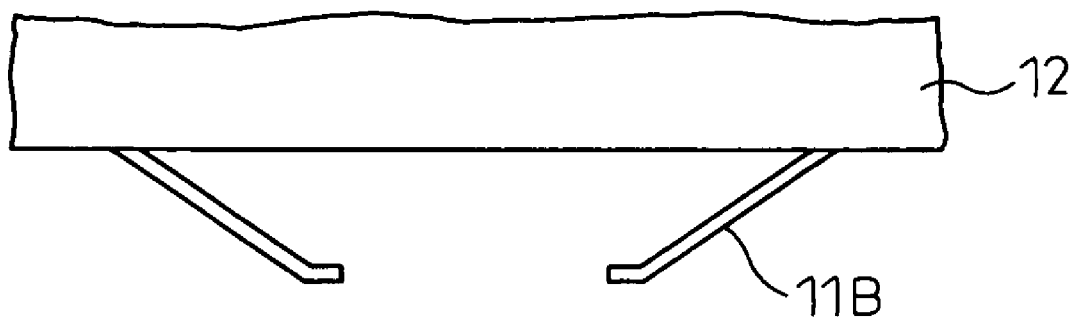
FIG. 5A and FIG. 5B are diagrams showing a probe of a probe card used in an embodiment.

FIG. 4 is a diagram showing an example of a wafer 100 used in an embodiment. The wafer 100 is a normal wafer to be inspected. On the wafer 100, many chips (semiconductor devices) 101 are formed and each chip 101 has electrodes 102 and 103 as shown in the lower part. A probe card 12 has a plurality of probes 11 arranged corresponding to the electrodes 102 and 103 of the chip. As shown in FIG. 5, a probe 11B has an elongated shape, the portion near the front end part is inclined with respect to the surface of the electrode, and has flexibility. Because of this, if the wafer if lifted and the electrode is brought into contact with the probe 11B, the probe 11B slides on the surface of the electrode and a trace extending in one direction occurs. The probe 11B that comes into with the electrode on the left-hand side in FIG. 4 is arranged as the probe on the left-hand side in FIG. 5A and the probe 11B that comes into contact with the electrode on the right-hand side is arranged as the probe on the right-hand side in FIG. 5A. Further, if the probe 11B that comes into contact with the electrode on the upper or lower side is rotated through 90 degrees, its arrangement will be such one in FIG. 5A. Therefore, if the wafer is lifted and the electrode is brought into contact with the probe 11B, the probe 11B corresponding to the electrode on each side slides toward the inner side of the chip.

In the present embodiment, among the electrodes shown in FIG. 4, the probe trace marked on to the two electrodes 102 on each side, that is, eight electrodes in total, is detected. Further, the probe trace is detected by bringing the probe into contact with the electrodes of the chips assigned with numbers 1 to 9 among the chips on the wafer 100 in FIG. 4.

Figure 6:
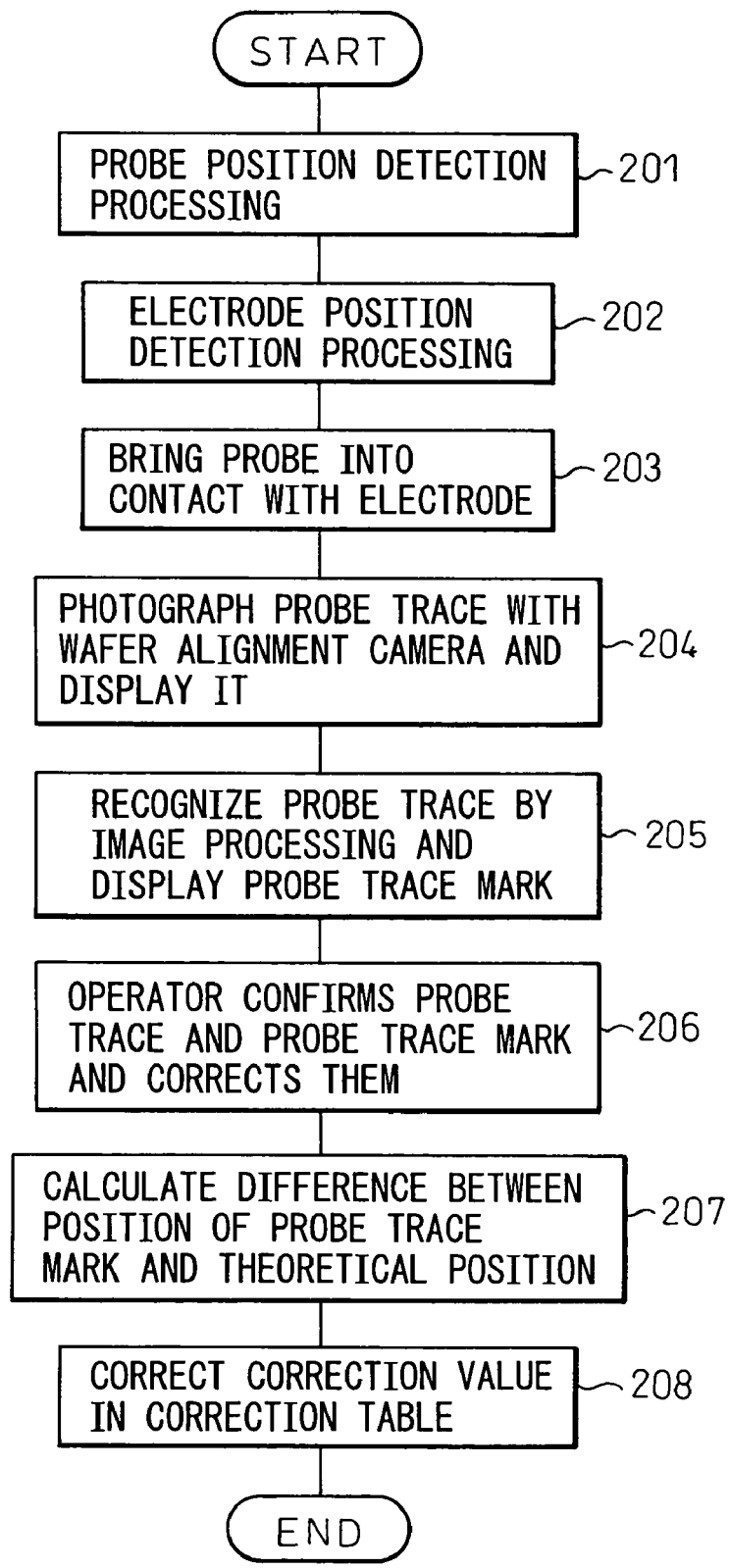
FIG. 6 is a flow chart showing movement amount operation correction processing in an embodiment.

FIG. 6 is a flow chart showing movement amount operation correction processing of a prober in the present embodiment.

In step 201, a probe position camera 23 moves so as to be located under the probe 11B of the probe card 12, the probe position camera 23 generates a signal of an image including the probe 11B and sends it to the image processing/operation processing section 31. The image processing/operation processing section 31 calculates the position of the probe 11B corresponding to the electrode 102 on which the position of the probe trace in FIG. 4 is detected. The position of the probe 11B thus calculated and the value of the movement position of the moving mechanism are stored.

In step 202, the chips on the wafer 100 assigned with numbers 1 to 9 move so as to be located under the alignment camera 13 in order and the positions of the eight electrodes 102 of each chip are detected. The electrode position is detected as, for example, the position of the edge of the electrode.

In step 203, an amount of movement for bringing the electrode into contact with the probe is calculated based on the probe position and the electrode position detected in steps 201 and 202, and the chips on the wafer 100 assigned with numbers 1 to 9 are moved to under the probe 11B and the electrode is brought into contact with the probe. Due to this, the probe trace occurs on the electrode. At this time, the probe comes into contact with a predetermined position, for example, a position a predetermined distance apart from the edge, to generate the probe trace.

In step 204, the chips on the wafer assigned with numbers 1 to 9 are moved so as to be located under the alignment camera 13 in order and a display device 34 displays the probe traces of the eight electrodes 102 of each chip photographed by the alignment camera 13.

In step 205, in the image photographed by the alignment camera 13, the probe trace of the electrode is recognized by image processing and a probe trace mark corresponding to the form of the probe trace is displayed.

FIG. 7A is a diagram showing an example of a probe trace mark. The probe 11B has a form extending in the transverse direction with respect to the electrode 102 in the figure and when the electrode is brought into contact with the probe, the probe slides in the transverse direction and a probe trace elongated in the transverse direction occurs. A probe trace mark is composed of a circular mark 105 and an elliptic mark 106 elongated in the transverse direction and is displayed on the image of the probe trace such that the circular and elliptic marks 105 and 106 coincide with the edges of the probe trace in the two directions.

In step 206, an operator compares the displayed probe trace and probe trace mark and confirms whether the position of the probe trace recognized by the operator coincides with the position of the probe trace mark. If they coincide, processing proceeds to step 207 without any action and if there is a difference, the position of the probe trace mark is moved so as to coincide therewith on the image.

Actually, this processing is performed for the eight electrode of each of the chips assigned with numbers 1 to 9. Therefore, the elliptic mark elongated in the transverse direction is displayed on the electrodes on the left-hand and right-hand sides and the elliptic mark elongated in the longitudinal direction is displayed on the electrodes on the upper and lower sides.

In step 207, the center of the circular and elliptic marks 105 and 106 is assumed to be the center of the probe trace of the elliptic mark in the minor axis direction, and a difference from a theoretical center position estimated based on the movement amount calculated in step 203 is calculated. Therefore, in the four electrodes on the right-hand and left-hand sides of each chip, the probe trace position in the longitudinal direction is calculated and in the four electrodes on the upper and lower sides of each chip, the probe trace position in the transverse direction is calculated. Then, a difference between the calculated probe trace position and the components of the respective theoretical positions in the corresponding direction is calculated.

In step 208, based on the difference calculated in step 207, the correction value in the correction table is corrected. As described above, the movement amount operation section 33 stores the correction value in the form of a correction table as shown in FIG. 8 in accordance with the movement position of a moving mechanism 24. By the way, such a correction table is provided twice because of the two-axis direction moving mechanism. The movement action in steps 201 to 203 is performed based on the correction value stored in the correction table. Therefore, the difference calculated in step 207 is an error caused by the movement action based on the correction value stored in the correction table, therefore, the correction value stored in the correction table is updated by correcting by the difference calculated in step 207. As shown in FIG. 4, the difference is calculated for the nine chips on the wafer 100 and the movement position differs from chip to chip, therefore, the correction table is corrected in accordance with the movement position of each chip. Further, when the interval of the movement position of the correction table is smaller than the interval of the movement position of the chip, a difference in accordance with the movement position of the correction table is calculated by an interpolation method etc.

In the above explanation, a normal wafer to be inspected, as shown in FIG. 4, is used and a probe card having the probe 11B, as shown in FIG. 5A, is used. With these, there is an advantage that a wafer and a probe card used in a normal process can be used. However, there is a problem in that it is difficult to recognize a probe trace marked using the wafer and the probe card as described above by image processing.

Figure 5B:
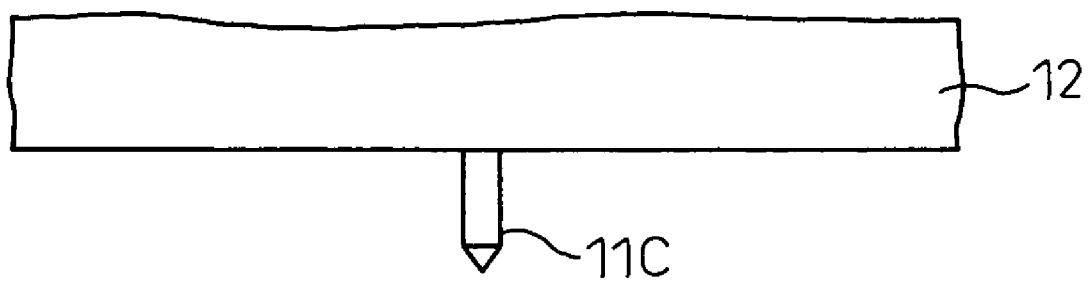

Therefore, it may also possible to make it possible to recognize the position of the probe trace by image processing more precisely using a special-purpose probe 11C used in the movement amount operation correction processing as shown in FIG. 5B. The probe 11C is a cylinder the front end of which is pointed as shown schematically and if the electrode is brought into contact therewith, it does not slide and a circular probe trace 107, as shown in FIG. 7B, appears. In this case, the probe trace 107 is clear and the position of the probe trace can be detected accurately by image processing. Further, the center position can be detected accurately in the two directions.

When the probe 11C in FIG. 5B is used, the wafer shown in FIG. 4 can be used. In this case, the eight (or four) electrodes of each chip are brought into contact with the probe 11C to cause the probe trace to occur.

Further, instead of the wafer shown in FIG. 4, for example, a special-purpose wafer on which many electrodes are arranged and having electrodes made of a soft material or by a forming method by which the surface is softened, may be used. Due to this, it is made possible to detect the probe trace position highly precisely by image processing.

As described above, due to the present invention, the precision in bringing an electrode into contact with a probe of a probe card is improved in a prober and, therefore, it is capable of being applied to an inspection of a wafer on which semiconductor devices (chips) having finer electrodes are formed.

We claim:

1. A method of a prober for correcting a movement amount operation correction value in a prober, the prober including: a probe card having a probe; a wafer chuck for holding a wafer on which an electrode is formed; a moving mechanism for moving the wafer chuck; a probe position detection means for detecting a position of the probe of the probe card; a wafer alignment means for detecting a position of the electrode of the wafer held by the wafer chuck; and a movement control section for controlling the moving mechanism, the movement control section comprising a movement amount operation section for calculating an amount of movement by the moving mechanism such that a predetermined position of the electrode is brought into contact with the probe based on the position of the probe detected by the probe position detection means, the position of the electrode detected by the wafer alignment means, and the movement amount operation correction value, the method comprising:
with the probe position detection means, detecting the position of the probe of the probe card;
with the wafer alignment means, detecting the position of the electrode;
bringing the electrode into contact with the probe;
with the wafer alignment means, processing an image of a probe trace on the electrode touched by the probe to detect a position of the probe trace;
displaying an image of the probe trace and a probe trace mark indicating the detected position of the probe trace on a display device;
confirming or correcting the position of the probe trace mark on the image;
calculating a shift of the position of the probe trace mark from the predetermined position; and
correcting the movement amount operation correction value based on the calculated shift.

2. The method as set forth in claim 1, wherein the probe card has a probe corresponding to an electrode of a semiconductor device in order to inspect the semiconductor device formed on the wafer.

3. The method as set forth in claim 1, wherein the probe card is a probe card for correction having a special-purpose probe for performing the movement amount operation correction method.

4. The method as set forth in claim 1, wherein the wafer is a wafer on which a semiconductor device having an electrode is formed.

5. The method as set forth in claim 1, wherein the wafer is a wafer for correction having a special-purpose electrode for performing the movement amount operation correction method.

6. The method as set forth in claim 2, wherein the probe has an elongated shape with flexibility and the probe card has two probes extending in different directions, the method further comprising
detecting the center position of the width of an elongated portion of the probe trace in each direction.

7. A prober comprising:
a probe card having a probe;
a wafer chuck for holding a wafer on which an electrode is formed;
a moving mechanism for moving the wafer chuck;
a probe position detection means for detecting a position of the probe of the probe card;
a wafer alignment means for detecting a position of the electrode of the wafer held by the wafer chuck; and
a movement control section for controlling the moving mechanism, the movement control section comprising a movement amount operation section for calculating an amount of movement by the moving mechanism such that a predetermined position of the electrode is brought into contact with the probe based on the position of the probe detected by the probe position detection means, the position of the electrode detected by the wafer alignment means, and the movement amount operation correction value,
wherein the wafer alignment means comprises:
a probe trace detection means for detecting a position of the probe trace by processing an image of a probe trace on the electrode touched by the probe; and
a display for displaying a mark indicating the position of the probe trace detected by the probe trace detection means and an image of the electrode having the probe trace.

* * * * *